United States Patent
Iwanaga et al.

(10) Patent No.: US 10,453,682 B2
(45) Date of Patent: Oct. 22, 2019

(54) EPITAXIAL WAFER MANUFACTURING METHOD AND EPITAXIAL WAFER

(71) Applicant: SUMCO CORPORATION, Tokyo (JP)

(72) Inventors: Takuro Iwanaga, Tokyo (JP); Kazunari Kurita, Tokyo (JP); Takeshi Kadono, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 15/996,924

(22) Filed: Jun. 4, 2018

(65) Prior Publication Data

US 2018/0286677 A1 Oct. 4, 2018

Related U.S. Application Data

(62) Division of application No. 15/104,692, filed as application No. PCT/JP2014/006163 on Dec. 10, 2014, now Pat. No. 10,062,569.

(30) Foreign Application Priority Data

Jan. 7, 2014 (JP) ................. 2014-001074

(51) Int. Cl.
*H01L 21/265* (2006.01)
*H01L 21/322* (2006.01)
(Continued)

(52) U.S. Cl.
CPC .... *H01L 21/02658* (2013.01); *H01L 21/0262* (2013.01); *H01L 21/02381* (2013.01);
(Continued)

(58) Field of Classification Search
CPC .................................................. H01L 29/34
See application file for complete search history.

(56) References Cited

U.S. PATENT DOCUMENTS

| 5,734,195 A * | 3/1998 | Takizawa ......... H01L 21/26506 257/607 |
| 2005/0181621 A1 | 8/2005 | Borland et al. |

(Continued)

FOREIGN PATENT DOCUMENTS

| CN | 1556255 | 12/2004 |
| DE | 112012002072 | 2/2014 |

(Continued)

OTHER PUBLICATIONS

International Search Report issued with respect to Application No. PCT/JP2014/006163, dated Mar. 10, 2015, with English translation.

(Continued)

*Primary Examiner* — Moazzam Hossain
*Assistant Examiner* — Omar F Mojaddedi
(74) *Attorney, Agent, or Firm* — Greenblum & Bernstein, P.L.C.

(57) ABSTRACT

Provided is an epitaxial wafer having an excellent gettering capability and a suppressed formation of epitaxial defects. The epitaxial wafer has a specified resistivity, and includes a modifying layer formed on a surface portion of the silicon wafer and composed of a predetermined element including at least carbon, in the form of a solid solution in the silicon wafer; and an epitaxial layer having a resistivity that is higher than the resistivity of the silicon wafer, wherein a concentration profile of the predetermined element in the modifying layer in a depth direction thereof meets a specified full width half maximum and a specified peak concentration.

4 Claims, 4 Drawing Sheets

(51) Int. Cl.
  *H01L 29/34* (2006.01)
  *H01L 21/02* (2006.01)
  *H01L 29/36* (2006.01)
(52) U.S. Cl.
  CPC .. *H01L 21/02447* (2013.01); *H01L 21/02532* (2013.01); *H01L 21/26506* (2013.01); *H01L 21/26566* (2013.01); *H01L 21/3221* (2013.01); *H01L 29/36* (2013.01)

(56) References Cited

U.S. PATENT DOCUMENTS

| | | | |
|---|---|---|---|
| 2006/0175613 A1* | 8/2006 | Lee | H01L 21/02529 257/65 |
| 2009/0256241 A1* | 10/2009 | Kurita | H01L 21/30625 257/617 |
| 2010/0307582 A1 | 12/2010 | Arai | |
| 2014/0080247 A1 | 3/2014 | Kadono et al. | |

FOREIGN PATENT DOCUMENTS

| | | |
|---|---|---|
| JP | H05-152304 | 6/1993 |
| JP | H08-017841 | 1/1996 |
| JP | 2012-094575 | 5/2012 |
| TW | 200903646 | 1/2009 |
| TW | 201207166 | 2/2012 |
| TW | 201246298 | 11/2012 |
| TW | 201303092 | 1/2013 |
| WO | 2011/125305 | 10/2011 |
| WO | 2012/017162 | 2/2012 |
| WO | 2012/157162 | 11/2012 |

OTHER PUBLICATIONS

International Preliminary Report on Patentability issued with respect to Application No. PCT/JP2014/006163, dated Jul. 12, 2016, with English translation.
Taiwanese Office Action issued with respect to Application No. 103146424, dated Oct. 14, 2015.
Japanese Office Action issued with respect to Application No. 2014-001074, dated Jul. 28, 2016, with English translation.
Office Action issued in Korean Counterpart Application No. 10-2016-7016687, dated Jan. 24, 2017, with English translation.
Korean Notification of Reasons for Refusal in respect to Korean Application No. 10-2016-7016687, dated Jul. 28, 2017, with English Translation.
Office Action issued in Chinese Patent Office for Application 201480068022.X dated Mar. 28, 2018 with English translation.
Office Action issued in German Patent Office for corresponding German Patent Application 11 2014 006 124.7 dated Jun. 12, 2018 with English translation.
Office Action issued in corresponding Chinese Patent Application No. 201480068022 dated Oct. 15, 2018.

* cited by examiner

EPITAXIAL WAFER MANUFACTURING METHOD AND EPITAXIAL WAFER

The present application is a Divisional Application of U.S. application Ser. No. 15/104,692, filed on Jun. 15, 2016, which is a U.S. National Stage Application of International Patent Application No. PCT/JP2014/006163 filed on Dec. 10, 2014, which claims priority to Japanese Application No. 2014-001074 filed on Jan. 7, 2014. The disclosures of U.S. application Ser. No. 15/104,692 and International Patent Application No. PCT/JP2014/006163 are incorporated by reference herein in their entireties.

TECHNICAL FIELD

The present disclosure relates to a method of manufacturing an epitaxial wafer and an epitaxial wafer, and especially relates to a method of manufacturing an epitaxial wafer having an excellent gettering capability while suppressing formation of epitaxial defects.

BACKGROUND

In recent years, due to the development of increasingly miniaturized silicon devices, a device forming region is required not to have crystal defects which may cause an increase in leak current and a decrease in lifetime of a carrier. To meet the requirement, an epitaxial wafer, in which an epitaxial layer is grown on a silicon wafer, is produced, and the surface epitaxial layer is used as the device forming region.

Meanwhile, one problem in the process of manufacturing such a silicon device may be contamination of heavy metals into the wafer. For example, the wafer contaminated with heavy metals, such as cobalt, copper, and nickel, will cause harmful effects on the device characteristics, including poor pose time, poor retention, poor junction leak, and insulation breakage of an oxide film. In view of the above, a gettering method is typically adopted to suppress diffusion of the heavy metals into the device forming region.

Examples of a gettering method include an intrinsic gettering method (IG method) of precipitating oxygen in the wafer to use the formed oxide precipitates as a gettering site, and an extrinsic gettering method (EG method) of applying mechanical strain to a back surface of the wafer by a sand blast process or the like or of forming, as a gettering site, a polycrystalline silicon film or the like on the back surface.

However, due to the lowered temperature at the device formation process and the increased diameter of the silicon wafer, the problem that the silicon wafer, and thus the epitaxial wafer are not imparted with a sufficient gettering capability has occurred. That is to say, the lowered temperature at the formation process has made it difficult to form oxide precipitates in the wafer. Furthermore, in cases of the silicon wafer having a diameter of 300 mm or more, typically, not only the main surface but also the back surface is subject to mirror-polishing processing, and therefore, mechanical strain cannot be applied to the back surface of the wafer, and a polycrystalline silicon film cannot be formed thereon. Thus, at the present, imparting a gettering capability to the wafer is difficult.

Under the above background, Patent Literature 1 proposes, as a method of imparting a gettering capability to an epitaxial wafer, the technology of producing an epitaxial wafer having an excellent gettering capability by implanting carbon ions into a surface of a silicon wafer, producing a silicon wafer in which a gettering layer, including a region (hereinafter, called the "high concentration carbon region") containing high concentration carbon, is formed on a surface portion of the silicon wafer, and subsequently forming an epitaxial layer on the surface of the produced silicon wafer.

However, when contaminating metals attach to the surface of the wafer at the time of forming the epitaxial layer on the silicon wafer or forming a device element on the device forming region, the contaminating metals are unable to detach from the device forming region due to the lowered temperature at the device forming process, thereby possibly failing to be captured by the gettering sites located deep beneath the surface of the wafer.

Moreover, to form the gettering layer by implanting carbon ions at a high concentration into the location deep beneath the surface of the wafer, acceleration voltage of the carbon ions needs to be increased. This may lead to degradation of crystallinity on the surface of the wafer, resulting in the problem of defects of the epitaxial layer grown thereon.

As a method for solving the problems, Patent Literature 2 describes the technology of manufacturing an epitaxial wafer that solves the problem of degradation of crystallinity on the surface of the wafer and that also has an improved gettering capability, by forming a modifying layer as the gettering layer including the high concentration carbon region by irradiating the wafer with ions of cluster of a plurality of atoms or molecules into a shallow location very close to the surface of the silicon wafer.

CITATION LIST

Patent Literature

PTL 1: H05152304A
PTL 2: WO2012017162

SUMMARY

Technical Problem

The modifying layer formed by cluster ion irradiation as described in Patent Literature 2 has a better gettering capability than the gettering layer formed by the ion implantation process as described in Patent Literature 1. However, as described above, the development of increasingly miniaturized devices have generated increasingly severe demands for countermeasures against metal contamination, and further improvement in gettering capability is sought for.

To improve the gettering capability of the epitaxial wafer in the cluster ion irradiation technology described in Patent Literature 2, a dose of cluster ions to be irradiated may be increased. However, the present inventors have tried to produce an epitaxial wafer by irradiating the silicon wafer with cluster ions at an increased dose in an attempt to improve the gettering capability, and found that crystal defects (i.e., epitaxial defects) formed in the epitaxial layer are increased.

In this way, improvement in gettering capability and decrease in epitaxial defects have a trade-off relation in imparting a gettering capability to the epitaxial wafer by using the cluster ion irradiation technology, and there is a need for establishing a way to manufacture an epitaxial wafer having an excellent gettering capability while suppressing formation of epitaxial defects.

Accordingly, the present disclosure is to provide a method of manufacturing an epitaxial wafer having an excellent gettering capability while suppressing formation of epitaxial defects.

Solution to Problem

The present inventors have conducted earnest studies on a way to solve the above problem. Consequently, the present inventors have found that lowering a resistivity of the silicon wafer, which is a substrate of the epitaxial wafer, is effective for suppressing formation of defects in the epitaxial layer to provide the epitaxial wafer having an improved gettering capability by using the cluster ion irradiation technology.

However, generally speaking, the epitaxial wafer in which the epitaxial layer having a higher resistivity than the silicon wafer is formed by using the silicon wafer having a low resistivity faces the problem that the resistivity of the epitaxial layer may vary due to dopants and oxygen in the silicon wafer being diffused into the epitaxial layer by, for example, heat treatment in the device forming process.

The present inventors have conducted experiments and found that irradiating the silicon wafer having a low resistivity with cluster ions in a predetermined dose range suppresses diffusion of dopants from the silicon wafer into the epitaxial layer and also suppresses diffusion of oxygen from the silicon wafer into the epitaxial layer, and thus, achieved the present disclosure.

In detail, features of the present disclosure are as follows.
(1) A method of manufacturing an epitaxial wafer, including:
a cluster ion irradiation step of irradiating a surface of a silicon wafer having a resistivity of from 0.001 Ω·cm to 0.1 Ω·cm with cluster ions containing at least carbon at a dose of from $2.0 \times 10^{14}$ atoms/cm$^2$ to $1.0 \times 10^{16}$ atoms/cm$^2$ to form, on a surface portion of the silicon wafer, a modifying layer composed of a constituent element of the cluster ions in the form of a solid solution; and an epitaxial layer forming step of forming, on the modifying layer on the silicon wafer, an epitaxial layer having a resistivity that is higher than the resistivity of the silicon wafer.
(2) The method of manufacturing an epitaxial wafer according to (1), wherein the cluster ions includes two or more elements including carbon as a constituent element.
(3) The method of manufacturing an epitaxial wafer according to (1) or (2), wherein the resistivity of the silicon wafer is adjusted by addition of boron.
(4) The method of manufacturing an epitaxial wafer according to any one of (1) to (3) further including: a heat treatment step, performed after the cluster ion irradiation step and before the epitaxial layer forming step, of performing heat treatment in a non-oxidizing atmosphere at a temperature of from 500° C. to 1100° C.
(5) An epitaxial wafer, including: a silicon wafer having a resistivity of from 0.001 Ω·cm to 0.1 Ω·cm; and a modifying layer formed on a surface portion of the silicon wafer and composed of a predetermined element including at least carbon, in the form of a solid solution in the silicon wafer; and an epitaxial layer having a resistivity that is higher than the resistivity of the silicon wafer, wherein a concentration profile of the predetermined element in the modifying layer in a depth direction thereof has a full width half maximum of 100 nm or less, and the concentration profile in the modifying layer has a peak concentration of from $9.0 \times 10^{18}$ atoms/cm$^3$ to $1.0 \times 10^{21}$ atoms/cm$^3$.
(6) The epitaxial wafer according to (5), wherein the concentration profile in the modifying layer has a peak located in the range at a depth of 150 nm or less from a surface of the silicon wafer.
(7) The epitaxial wafer according to (5) or (6), wherein the predetermined element includes two or more elements including carbon.
(8) The epitaxial wafer according to any one of (5) to (7), wherein the resistivity of the silicon wafer is adjusted by addition of boron.

Advantageous Effects

According to the present disclosure, since the silicon wafer having a low resistivity is used as the substrate of the epitaxial wafer, the epitaxial wafer having an excellent gettering capability is achieved while formation of epitaxial defects is suppressed.

Furthermore, since the cluster ions are irradiated at a dose in the appropriate range to the aforementioned silicon wafer having a low resistivity, the diffusion of oxygen and dopants from the silicon wafer into the epitaxial layer is suppressed, and a variation in resistivity of the epitaxial layer is suppressed.

DETAILED DESCRIPTION

Method of Manufacturing Epitaxial Wafer

Figure 1A:
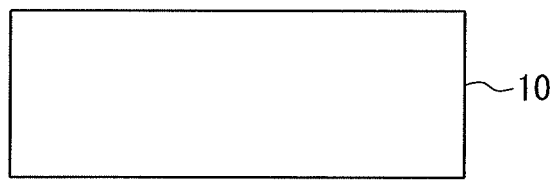
FIGS. 1A to 1D are schematic sectional views illustrating a method of manufacturing an epitaxial wafer according to the present disclosure.

Embodiments of the present disclosure will be described below with reference to the drawings. FIG. 1 is a schematic sectional view illustrating a method of manufacturing an epitaxial wafer according to the present disclosure. The method of manufacturing an epitaxial wafer 100 illustrated in the figure includes a cluster ion irradiation step (FIGS. 1A to 1C) of irradiating a surface 10A of a silicon wafer 10 with cluster ions 16 containing at least carbon to form, on a surface portion of the silicon wafer 10, a modifying layer 18 composed of a constituent element of the cluster ions 16 in the form of a solid solution, and an epitaxial layer forming step (FIG. 1D) of forming, on the modifying layer 18 on the silicon wafer 10, an epitaxial layer 20 having a higher resistivity than the silicon wafer 10. Herein, it is essential that the silicon wafer 10 have a resistivity of from 0.001 Ω·cm to 0.1 Ω·cm and that the cluster ions 16 be irradiated at a dose of from $2.0 \times 10^{14}$ atoms/cm$^2$ to $1.0 \times 10^{16}$ atoms/cm$^2$.

By thus increasing a dose of the cluster ions when irradiating the silicon wafer with the cluster ions to impart a gettering capability to the epitaxial wafer, the gettering capability of the epitaxial wafer is improved. Furthermore, by using the silicon wafer having a low resistivity, formation of defects in the epitaxial layer is suppressed. The reason appears to be that addition of high concentration dopants reduces the heat conductivity of the silicon wafer per se, and heat generated when the cluster ions collide with the surface of the silicon wafer is less likely to be removed, and accordingly, damages caused by irradiation of the cluster ions on the surface of the silicon wafer tend to be recovered by the heat generated by irradiation of the cluster ions.

Thus, in the cluster ion irradiation technology, the use of the silicon wafer having a resistivity of from 0.001 Ω·cm to 0.1 Ω·cm allows manufacturing of an epitaxial wafer having an excellent gettering capability, while formation of epitaxial defects is suppressed. Meanwhile, a resistivity of higher than 0.1 Ω·cm will not provide a satisfactory effect of suppressing formation of epitaxial defects due to high resistance, and a resistivity of lower than 0.001 Ω·cm will hinder growth of silicon crystal per se.

Furthermore, by setting a dose of the irradiated cluster ions to be $2.0\times10^{14}$ atoms/cm$^2$ or more, diffusion of dopants and oxygen in the silicon wafer into the epitaxial layer is suppressed even after heat treatment in the device forming process, and a variation in resistivity of the epitaxial layer is suppressed. The reason appears to be that, although interstitial silicon enhances diffusion of dopants, high concentration carbon in the irradiated cluster ions is bonded to interstitial silicon and reduces the concentration of interstitial silicon, and consequently, suppresses diffusion of dopants. However, a dose of greater than $1.0\times10^{16}$ atoms/cm$^2$ might increase disturbance of crystallinity on the outermost surface of the silicon wafer, possibly increasing the number of defects formed in the epitaxial layer during epitaxial growth processing.

Thus, the use of the silicon wafer having a resistivity of from 0.001 Ω·cm to 0.1 Ω·cm and the irradiation of the cluster ions at a dose of from $2.0\times10^{14}$ atoms/cm$^2$ to $1.0\times10^{16}$ atoms/cm$^2$ provide an epitaxial wafer having an excellent gettering capability that suppressed diffusion of dopants and oxygen in the silicon wafer into the epitaxial layer during heat treatment in the device forming process while suppressing formation of epitaxial defects. The following describes steps included in the method of manufacturing an epitaxial wafer according to present disclosure.

Firstly, as the substrate of the epitaxial wafer 100, the silicon wafer 10 having a resistivity of from 0.001 Ω·cm to 0.1 Ω·cm is prepared (FIG. 1A). A resistivity herein may be measured by any measurement method, such as the Spreading Resistance Analysis (SR) method and the four point probe method.

Such a single-crystal silicon ingot as the material of the silicon wafer 10 may be produced by, for example, the Czochralski (CZ) method. In detail, seed crystal is immersed in a molten liquid of silicon contained in a quartz crucible, and the seed crystal is pulled up while the quartz crucible and the seed crystal are rotated, and thus, a single-crystal silicon ingot may be produced.

The resistivity may be set to the aforementioned range by adjusting the amount of dopants poured into the quartz crucible. As the dopants, for example, any of boron, phosphorus, antimony, and arsenic dopants, whether p-type or n-type, may be used. Additionally, arsenic and antimony evaporate very easily, and this makes it difficult to satisfactorily increase the concentration of the dopants in silicon crystal and raises the issue of difficulty in manufacturing silicon crystal having a low resistivity. On the other hand, boron and phosphorus have a segregation coefficient that is closer to 1 and allows manufacturing of the silicon wafer having a low resistivity. Accordingly, boron or phosphorus is preferably used. Especially, boron, when used, offers an advantage that the gettering effect with respect to, for example, Fe, whose diffusion rate is relatively low, may be enhanced.

Figure 1B:
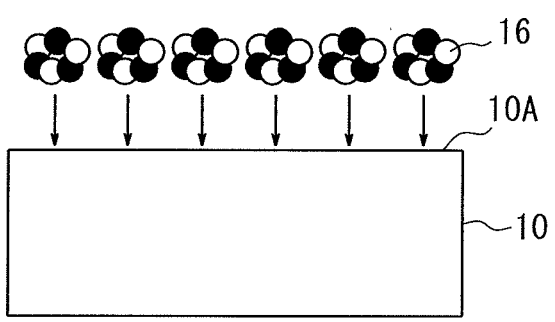
Figure 1C:

Secondly, cluster ions 16, i.e., an ionized cluster containing at least carbon, are irradiated on the surface 10A of the prepared silicon wafer 10 having a low resistivity (FIG. 1B). The irradiation of the cluster ions 16 allows a constituent element of the cluster ions 16 to be introduced to the surface portion of the silicon wafer 10 at a lower energy than that of monomer ions, and therefore, allows a location at which the concentration of the constituent element of the cluster ions 16 including carbon, is maximum to be positioned closer to the surface 10A compared with cases where monomer ions are implanted. The irradiation of the cluster ions 16 also narrows the range in the depth direction of the wafer in which the constituent element of the cluster ions 16 is distributed, and therefore, increase the maximum concentration of the constituent element of the cluster ions 16. Furthermore, since the cluster ions 16 are irradiated at a low energy, a decrease in crystallinity on the surface of the silicon wafer 10 is suppressed.

Herein, as a carbon source of the cluster ions, ethane, methane, propane, dibenzyl ($C_{14}H_{14}$), carbon dioxide ($CO_2$), or the like may be used. Due to easiness in forming small-sized cluster ion beams, clustered $C_nH_m$ ($3\leq n\leq 16$, $3\leq m\leq 10$) formed from pyrene ($C_{16}H_{10}$), dibenzyl ($C_{14}H_{14}$), or the like is preferably used.

A dose of the cluster ions 16 is from $2.0\times10^{14}$ atoms/cm$^2$ to $1.0\times10^{16}$ atoms/cm$^2$. As described above, with a dose of less than $2.0\times10^{14}$ atoms/cm$^2$, the diffusion of dopants and oxygen in the silicon wafer into the epitaxial layer cannot be suppressed. On the other hand, with a dose of greater than $1.0\times10^{16}$ atoms/cm$^2$, degradation of crystallinity on the outermost surface of the silicon wafer might be increased excessively, possibly causing defects to occur in the epitaxial layer during epitaxial growth processing. When the cluster ions are irradiated at a dose of from $2.0\times10^{14}$ atoms/cm$^2$ to $1.0\times10^{16}$ atoms/cm$^2$, a concentration profile of the constituent element in the modifying layer 18 in the depth direction thereof has a peak concentration of from $9.0\times10^{18}$ atoms/cm$^3$ to $1.0\times10^{21}$ atoms/cm$^3$.

Additionally, when the constituent element includes two or more elements, the "concentration profile of the constituent element in the depth direction" herein refers to an individual profile of each element, not of the elements in total.

In irradiation of the cluster ions, the depth location of the modifying layer 18 as the gettering layer depends on the acceleration voltage and cluster size of the cluster ions 16. For formation of the modifying layer 18 on the surface portion of the silicon wafer 10, the acceleration voltage of the cluster ions 16 is from greater than 0 keV/atom to less than or equal to 50 keV/atom. Preferably, the acceleration voltage is 40 keV/atom or less. The cluster size is 2 or more and is preferably 50 or less. Herein, the "cluster size" refers to the number of atoms or molecules constituting a single cluster.

Furthermore, the cluster ions preferably includes two or more elements including carbon as a constituent element, in other words, includes one or more element in addition to carbon. The reason is that types of metals that may be gettered effectively vary according to types of precipitated elements, and a wider variety of metal contamination may be addressed by forming a solid solution of two or more elements. For example, hydrogen, phosphorus, boron, or the like, in addition to carbon, may be included. For example, when carbon is included, nickel and copper may be gettered effectively, and when boron is included, copper and iron may be gettered effectively.

In this way, the modifying layer 18 as the gettering layer including the high concentration carbon region is formed on the surface portion of the silicon wafer 10, and the silicon wafer 10 having an excellent gettering capability is obtained.

Figure 1D:
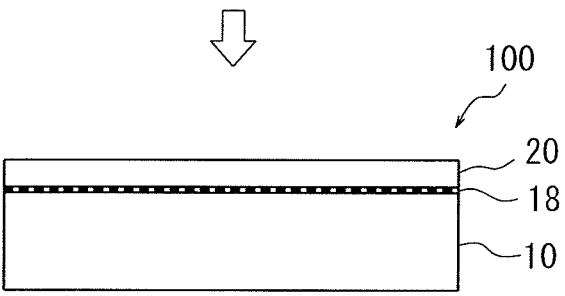

Subsequently, the epitaxial layer 20 is formed on the surface 10A of the silicon wafer 10 (FIG. 1D). The epitaxial layer 20 herein is, for example, a silicon epitaxial layer. The epitaxial layer 20 has a resistivity that is higher than the resistivity of the silicon wafer 10 and the value of the resistivity is, for example in the range higher than 0.01 Ω·cm to 100 Ω·cm. Preferably, the resistivity of the epitaxial layer 20 is more than 10 times of the resistivity of the silicon wafer 10. The epitaxial layer 20 also has a thickness that may be determined at will according to design, and the thickness is preferably from 1 μm to 15 μm.

The epitaxial layer 20 may be formed by a general method that is well-known. For example, with hydrogen being used as a carrier gas, source gases, such as dichlorosilane, trichlorosilane, and the like may be introduced into a chamber and epitaxially grown on the silicon wafer 10 by the Chemical Vapor Deposition (CVD) method at a temperature of approximately from 1000 to 1150° C.

The aforementioned method of manufacturing an epitaxial wafer according to the present disclosure may further include, after the cluster ion irradiation step and before the epitaxial layer forming step, recovery heat treatment by using a heat treatment apparatus that is different from an epitaxial apparatus. The recovery heat treatment may be performed at a temperature of from 500° C. to 1100° C. for a time period of from 10 seconds or more to 1 hour or less. The heat treatment temperature is set to be from 500° C. to 1100° C. because a temperature of less than 500° C. is unlikely to provide a crystallinity recovery effect, whereas a temperature of greater than 1100° C. will cause slip due to high-temperature heat treatment and increase heat load to the apparatus. The heat treatment time period is set to be from 10 seconds or more to 1 hour or less because a time period of less than 10 seconds is unlikely to provide the crystallinity recovery effect, whereas a time period of greater than 1 hour will lead to a decrease in productivity and increase heat load to the apparatus.

Such recovery heat treatment may be performed by using, for example, a heat treatment apparatus, such as a RTA and a RTO, with rapid heating up and down, and a batch-type heat treatment apparatus (a vertical heat treatment apparatus and a horizontal heat treatment apparatus). Since adopting a heating system using irradiation of a lamp, the former is not suited for long-time processing in terms of the apparatus configuration and is suited for heat treatment within 15 minutes. On the other hand, although requiring a long time period to increase temperature to a predetermined temperature, the latter is capable of processing a plurality of wafers at once. Furthermore, the latter adopts a heating system using resistance and is capable of long-time heat treatment. The heat treatment apparatus to be used may be selected suitably in consideration of conditions of irradiation of the cluster ions 16.

Epitaxial Wafer

Next, a description is given of the epitaxial wafer 100 according to the present disclosure. The epitaxial wafer 100 according to the present disclosure illustrated in FIG. 1D includes the silicon wafer 10 having a resistivity of from 0.001 Ω·cm to 0.1 Ω·cm, the modifying layer 18 formed on the surface portion of the silicon wafer 10 and composed of the predetermined element including at least carbon, in the form of a solid solution in the silicon wafer 10, and the epitaxial layer 20 having a resistivity that is higher than that of the silicon wafer 10. Herein, a concentration profile of the predetermined element in the modifying layer 18 in the depth direction has a full width half maximum of 100 nm or less, and the concentration profile in the modifying layer 18 has a peak concentration of from $9.0 \times 10^{18}$ atoms/cm$^3$ to $1.0 \times 10^{21}$ atoms/cm$^3$.

Since the epitaxial wafer 100 uses, as the substrate, the silicon wafer 10 having a low resistivity, the number of epitaxial defects formed in the epitaxial layer is reduced compared with cases where a silicon wafer having a high resistivity (such as 10 Ω·cm) is used. On the surface portion of the silicon wafer 10, that is to say, right below the epitaxial layer 20, the epitaxial wafer 100 also includes the modifying layer 18 including the high concentration carbon region containing carbon whose concentration profile has a peak concentration of from $9.0 \times 10^{18}$ atoms/cm$^3$ to $1.0 \times 10^{21}$ atoms/cm$_3$.

The "concentration profile in the depth direction" herein refers to the distribution of concentration in the depth direction measured by Secondary Iron Mass Spectrometry (SIMS). In consideration of accuracy of measurement, when the thickness of the epitaxial layer is greater than 1 μm, the "full width half maximum of the concentration profile of the predetermined element in the depth direction" refers to a full width half maximum of the concentration profile of the predetermined element measured by SIMS in the state where the epitaxial layer is thinned to 1 μm.

From the perspective of achieving an even better gettering capability in the above epitaxial wafer according to the present disclosure, the concentration profile in the modifying layer 18 preferably has a peak located in the range at a depth of 150 nm or less from the surface of the silicon wafer 10.

As described previously, the at least one predetermined element preferably includes two or more elements, including carbon.

Furthermore, the thickness of the modifying layer 18 in the depth direction may be in the range approximately from 30 to 400 nm.

Thus, the epitaxial wafer 100 according to the present disclosure is an epitaxial wafer having an excellent gettering capability that exhibits few epitaxial defects and that also suppresses dopants and oxygen in the silicon wafer from being diffused into the epitaxial layer during heat treatment in the device forming process.

EXAMPLES

Examples 1 to 3

Examples of the present disclosure are described below.

Firstly, as substrates of epitaxial wafers, silicon wafers each having a diameter of 300 mm, a thickness of 775 and a resistivity of approximately 0.003 Ω·cm was prepared. Secondly, $C_3H_5$ cluster ions as a cluster ions were generated using a cluster ion generator (model: CLARIS manufactured by Nissin Ion Equipment Co., Ltd.) and irradiated on a surface of each silicon wafer under the condition that the acceleration voltage per carbon atom was 23.4 keV/atom. At this time, a dose of the cluster ions was varied to three levels, namely, $1.0\times10^{15}$ atoms/cm² (Example 1), $5\times10^{15}$ atoms/cm² (Example 2), and $2\times10^{14}$ atoms/cm² (Example 3). Subsequently, the silicon wafer was transferred into a single wafer processing epitaxial growth apparatus (produced by Applied Materials, Inc.) and subjected to hydrogen baking at 1120° C. for 30 seconds in the apparatus. After that, a silicon epitaxial layer (thickness: 4.0/μm, dopant: boron, resistivity: approximately 0.3 Ω·cm) was epitaxially grown on the silicon wafer by CVD at 1150° C. using hydrogen as a carrier gas and trichlorosilane as a source gas, and thus, the epitaxial wafers according to the present disclosure were obtained.

Comparative Examples 1 to 4

An epitaxial wafer of Comparative Example 1 was prepared in the same manner as Example 1 (i.e., with a dose of $1.0\times10^{15}$ atoms/cm²), except for that a silicon wafer having a resistivity of approximately 10 Ω·cm was used as the substrate.

An epitaxial wafer of Comparative Example 2 was prepared in the same manner as Example 2 (i.e., with a dose of $5\times10^{15}$ atoms/cm², except for that a silicon wafer having a resistivity of approximately 10 Ω·cm was used as the substrate.

An epitaxial wafer of Comparative Example 3 was prepared in the same manner as Example 1, except for that cluster ions were not irradiated on the silicon wafer.

An epitaxial wafer of Comparative Example 4 was prepared in the same manner as Example 1, except for that a dose of the cluster ions was changed to a reduced dose of $1\times10^{14}$ atoms/cm².

Evaluation of Epitaxial Defects

The number of epitaxial defects formed in the epitaxial layer was evaluated for each of the aforementioned epitaxial wafers of Examples 1 to 3 and Comparative Examples 1 to 4. In detail, by using a surface defect detection apparatus (SURFSCAN SP-1 manufactured by KLA-Tencor Corporation), occurrence condition of Light Point Defects (LPDs) was observed for evaluation. At this time, an observation mode was set to a Dark Field Composite Normal (DCN) mode, concretely under the conditions that LPDs having a size (diameter) of 90 nm or more in a Dark Field Wide Normal (DWN) mode and 110 nm or more in a Dark Field Narrow Normal (DNN) mode were targeted for detection. Subsequently, by using a Scanning Electron Microscope (SEM), portions in which LPDs occurred were observed to assess whether the LPDs indicated stacking faults. This assessment was conducted for 10 pieces of wafers prepared for each of Examples 1 to 3 and Comparative Examples 1 to 4, and the average number of stacking faults per wafer was obtained. The result was that the average number of stacking faults per wafer was 3.2 in Example 1 and 2.8 in Example 2 (and 2.5 in Example 3), while the average number was 5.0 in Comparative Example 1, 6.0 in Comparative Example 2 (and 2.2 in Comparative Example 3 and 2.3 in Comparative Example 4). In this way, the numbers of epitaxial defects in the epitaxial wafers of Examples 1 and 2, in which a dose was increased, was less than those in the epitaxial wafers in Comparative Examples 1 and 2, in which the same dose was used, and this has confirmed that the use of the substrate having a low resistivity suppresses formation of epitaxial defects. Additionally, the number of epitaxial defects was small in the epitaxial wafers of Comparative Example 3, in which cluster ions were not irradiated, and Comparative Example 4, in which a reduced dose of $1\times10^{14}$ atoms/cm² was used.

Evaluation of Gettering Capability

The gettering capability was evaluated for each of the aforementioned epitaxial wafers of Examples 1 to 3 and Comparative Examples 1 to 4. In detail, a surface of the epitaxial layer of each epitaxial wafer was contaminated on purpose by a spin coat contamination method using Cu contaminant liquid ($1.0\times10^{13}$/cm²) and was then subjected to diffusion heat treatment at 1000° C. for 1 hour. Subsequently, a concentration peak of Cu was evaluated by SIMS measurement.

The result was that a concentration peak of Cu of $1\times10^{16}$ atoms/cm² or more was detected in all the epitaxial wafers of Examples 1 to 3 (and Comparative Examples 1 and 2), while any Cu concentration peak was not observed in the epitaxial wafers of Comparative Example 3, in which cluster ions were not irradiated, and in Comparative Example 4, in which a reduced dose was used. It has been confirmed that increasing a dose in irradiation of the cluster ions improves the gettering capability.

Dependence of Effect of Suppressing Diffusion of Dopants and Oxygen on Dose

Next, the following experiment was conducted to study a relation between the effect of suppressing diffusion of dopants and oxygen into an epitaxial layer, and a dose of the cluster ions.

Figure 2:
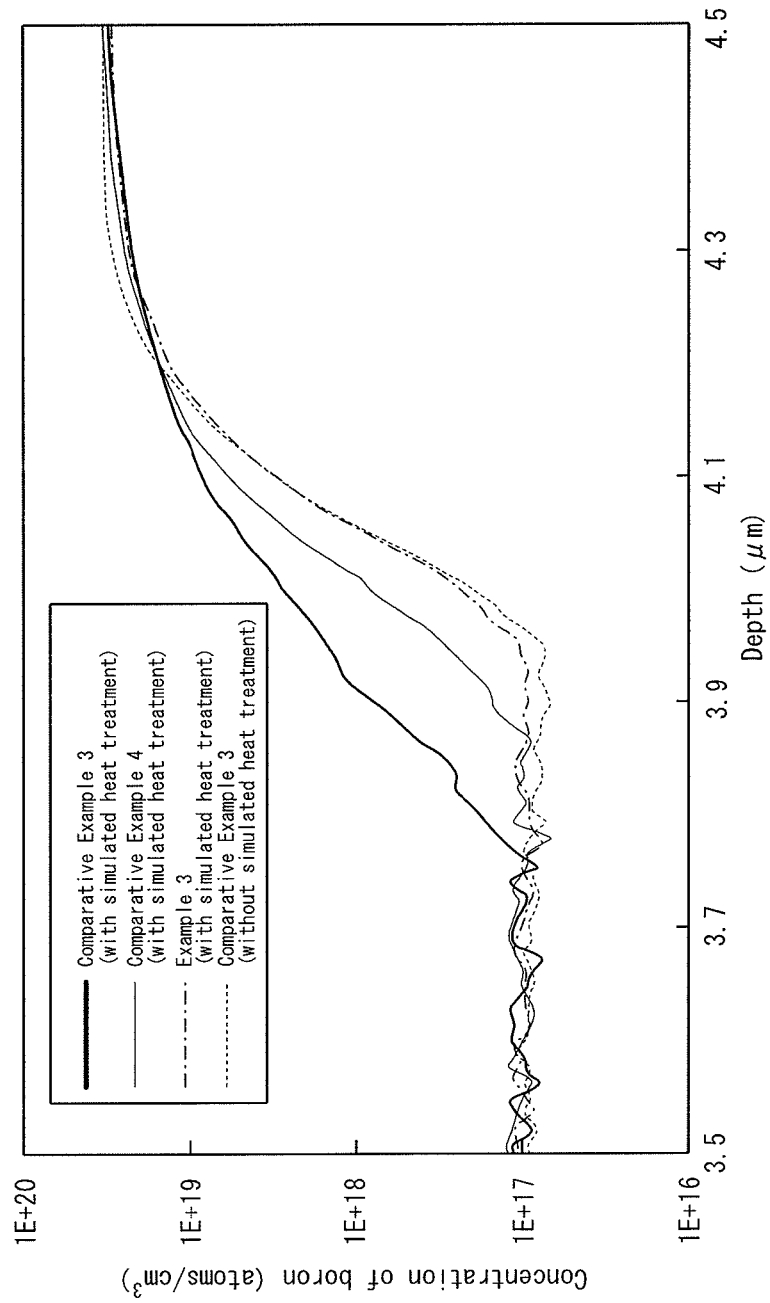
FIG. 2 illustrates a relation between a dose of cluster ions and the effect of suppressing boron from being diffused into an epitaxial layer.

That is to say, simulated heat treatment (gas atmosphere: nitrogen atmosphere containing 3% by volume of oxygen, heat treatment temperature: heat treatment sequence with a highest attainment temperature of 900° C. or less, total heat treatment time: 60 hours), simulating heat treatment in the device forming process, was performed on the aforementioned epitaxial wafers of Example 3, Comparative Example 3, and Comparative Example 4. After that, the concentration distribution of boron in the depth direction was studied for each epitaxial wafer by SIMS. For reference, the similar evaluation was conducted on the epitaxial wafers of Comparative Example 3 in which simulated heat treatment was not performed. FIG. 2 shows results of assessment.

As can be seen clearly from FIG. 2, in Comparative Example 3, in which cluster ions are not irradiated (i.e., a dose is 0), boron in the silicon wafer is diffused into the epitaxial wafer significantly after simulated heat treatment than before simulated heat treatment. However, as a dose of the cluster ions is increased, the diffusion of boron into the epitaxial layer is suppressed, and in Example 3, in which a dose is $2.0\times10^{14}$ atoms/cm², the concentration profile of boron is substantially the same as that in the epitaxial wafer in which cluster ions are not irradiated before simulated heat treatment. That is to say, a dose of $2.0\times10^{14}$ atoms/cm² or more has been found to suppresses diffusion of boron in the silicon wafer into the epitaxial layer.

Figure 3:
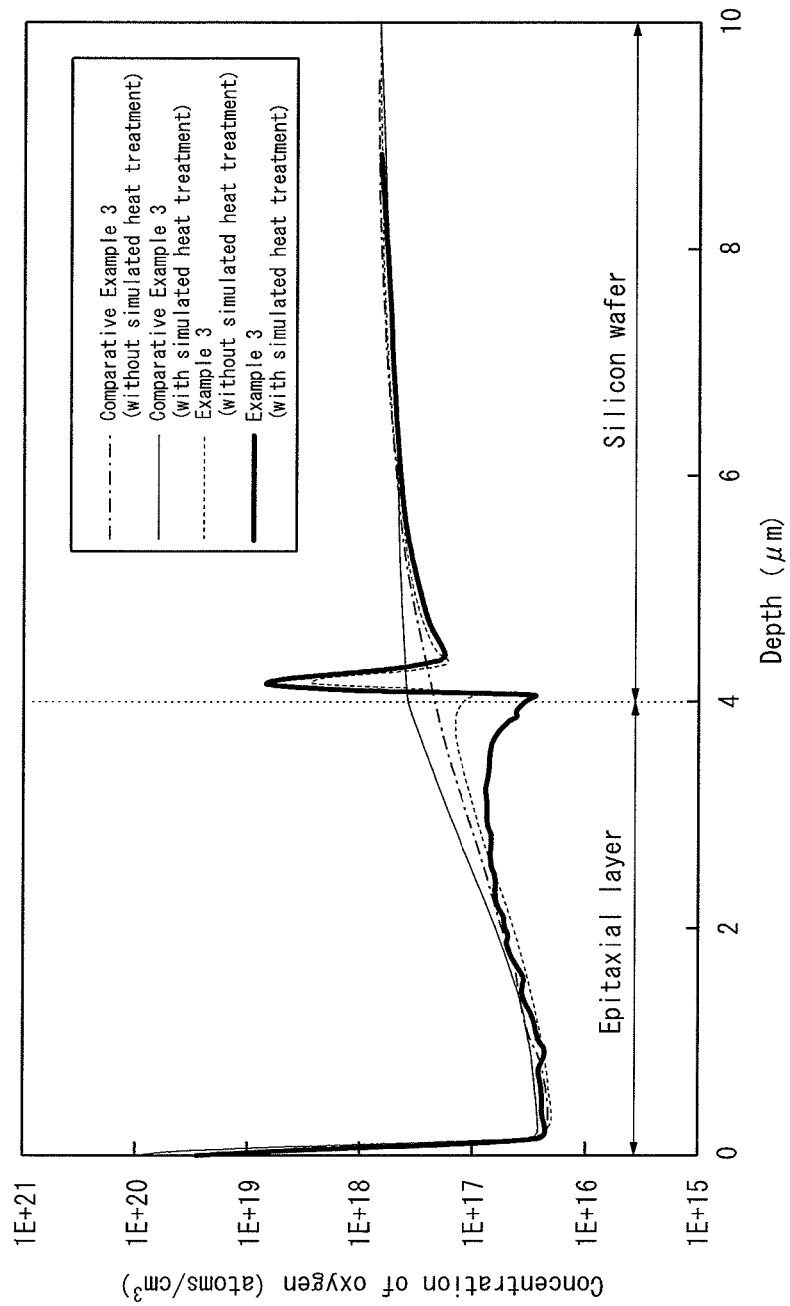
FIG. 3 illustrates the effect that the diffusion of oxygen in a silicon wafer into an epitaxial layer is suppressed by a method of manufacturing an epitaxial wafer according to the present disclosure.

Simulated heat treatment (gas atmosphere: nitrogen atmosphere containing 3% by volume of oxygen, heat treatment temperature: heat treatment sequence with a highest attainment temperature of 900° C. or less, total heat treatment time: 60 hours), simulating heat treatment in the device forming process, was performed on the aforementioned epitaxial wafers of Example 3 and Comparative Example 3. Then, the concentration distribution of oxygen in the depth direction was studied for each epitaxial wafer by SIMS. The similar assessment was conducted on the epitaxial wafers of Example 3 and Comparative Example 3 in which simulated heat treatment was not performed. FIG. 3 shows results of assessment.

As can be seen clearly from FIG. 3, in Comparative Example 3, in which cluster ions are not irradiated (i.e., a dose is 0), the concentration of oxygen is increased in a region of the epitaxial layer that is located near an interface between the epitaxial layer and the silicon wafer after simulated heat treatment than before simulated heat treatment. On the other hand, in Example 3, in which a dose of cluster ions is $2.0 \times 10^{14}$ atoms/cm$^2$, the concentration profile of oxygen before simulated heat treatment is substantially the same as that after simulated heat treatment, and on the contrary, the concentration of oxygen has been found to be reduced in the region of the epitaxial layer that is located near the interface between the epitaxial layer and the silicon wafer.

Figure 4A:
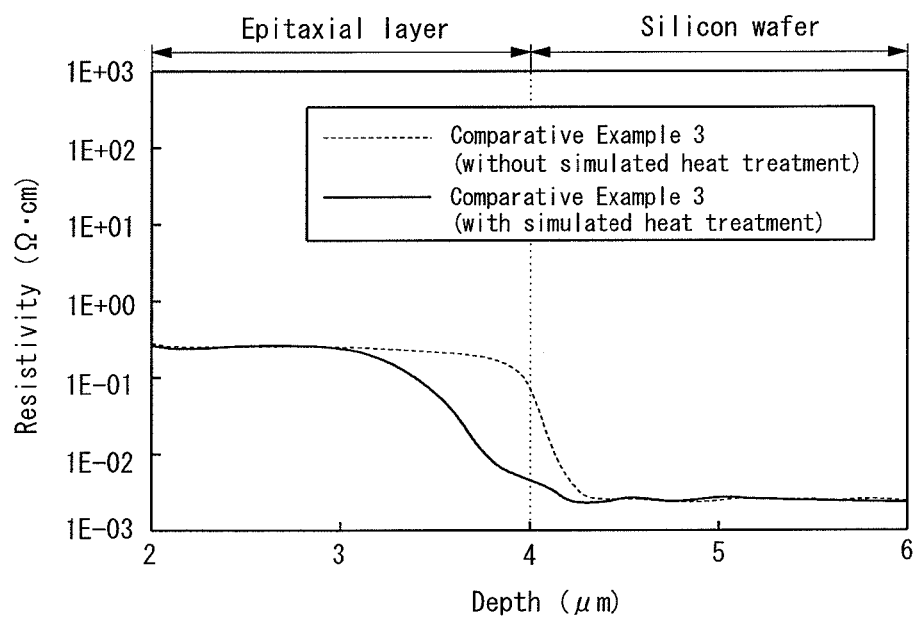
FIGS. 4A and 4B each illustrate the effect that a variation in resistivity in a silicon wafer is suppressed by a method of manufacturing an epitaxial wafer according to the present disclosure.
Figure 4B:
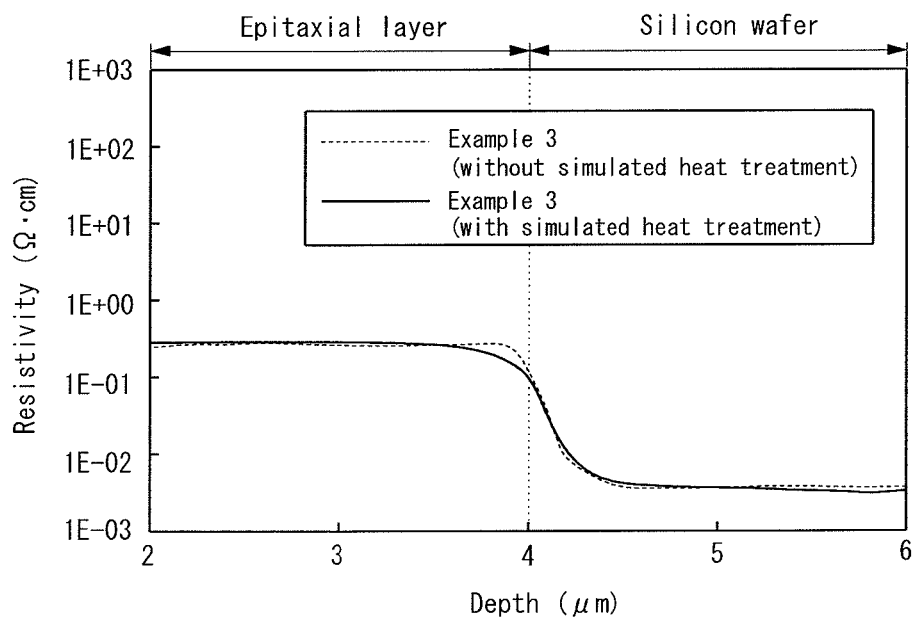

FIGS. 4A and 4B each illustrate the effect that a variation in resistivity in a silicon wafer is suppressed by a method of manufacturing an epitaxial wafer according to the present disclosure. FIG. 4A illustrates the distribution of resistivity in the depth direction in the epitaxial wafers of Comparative Example 3 before and after the aforementioned simulated heat treatment, and FIG. 4B illustrates the distribution of resistivity in the depth direction in the epitaxial wafers of Example 3 before and after the aforementioned simulated heat treatment. The distribution of resistivity in the depth direction is measured by the SR method by using a resistivity measurement apparatus (model: SSM2000, manufactured by Japan SSM Co. Ltd.).

As can be seen clearly from FIGS. 4A and 4B, in Comparative Example 3, the resistivity is reduced in the region of the epitaxial layer that is located near the interface between the epitaxial layer and the silicon wafer after simulated heat treatment. On the other hand, in Example 3, the resistivity has been found to be changed little in the region of the epitaxial layer that is located near the interface between the epitaxial layer and the silicon wafer.

The similar assessment was also conducted on the epitaxial wafers manufactured under the same conditions as Examples 1 to 3, except for that silicon wafers having a resistivity of 0.001 Ω·cm and silicon wafers having a resistivity of 0.1 Ω·cm were used, and substantially the same effects of reducing epitaxial defects and suppressing a variation in resistivity as the aforementioned experimental results have been confirmed.

INDUSTRIAL APPLICABILITY

The present disclosure allows manufacturing of an epitaxial having an excellent gettering capability that suppresses formation of epitaxial defects and that also suppresses diffusion of dopants and oxygen in the silicon wafer into the epitaxial layer during heat treatment in the device forming process and may be useful in the semiconductor wafer manufacturing industry.

REFERENCE SIGNS LIST

10: Silicon wafer
10A: Surface of silicon wafer
16: Cluster ion
18: Modifying layer
20: Epitaxial layer
100: Epitaxial wafer

The invention claimed is:

1. An epitaxial wafer, comprising:
   a silicon wafer having a resistivity adjusted to a range of from 0.001 Ω·cm to 0.1 Ω·cm to thereby suppress formation of defects in an epitaxial layer of the wafer; and
   a modifying layer formed in a surface portion of the silicon wafer and composed of
      a predetermined element including at least carbon, in the form of a solid solution in the silicon wafer; and
      an epitaxial layer having a resistivity that is higher than the resistivity of the silicon wafer, wherein
         a concentration profile of the predetermined element in the modifying layer in a depth direction thereof has a full width half maximum of 100 nm or less, and
         the concentration profile in the modifying layer has a peak concentration of from $9.0 \times 10^{18}$ atoms/cm$^3$ to $1.0 \times 10^{21}$ atoms/cm$^3$, and wherein
         the concentration profile in the modifying layer has a peak located in the range at a depth of 150 nm or less from a surface of the silicon wafer.

2. The epitaxial wafer according to claim 1, wherein the predetermined element comprises two or more elements including carbon.

3. The epitaxial wafer according to claim 1, wherein the resistivity of the silicon wafer is adjusted by addition of boron.

4. The epitaxial wafer according to claim 2, wherein the resistivity of the silicon wafer is adjusted by addition of boron.

* * * * *